(12) United States Patent
Andrews et al.

(10) Patent No.: US 6,270,353 B1
(45) Date of Patent: Aug. 7, 2001

(54) LOW COST SHALLOW TRENCH ISOLATION USING NON-CONFORMAL DIELECTRIC MATERIAL

(75) Inventors: John W. Andrews, Wappinger Falls; Bao T. Hwang, Poughkeepsie, both of NY (US); Howard S. Landis, Underhill, VT (US); Shaw-Ning Mei, Poughkeepsie, NY (US); James M. Tyler, Lagrangeville, NY (US); Edward J. Vishnesky, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/326,925

(22) Filed: Jun. 7, 1999

(51) Int. Cl.[7] .................................................. H01L 21/76
(52) U.S. Cl. ........................................... 434/424; 438/427
(58) Field of Search ...................................... 438/424, 427

(56) References Cited

U.S. PATENT DOCUMENTS

| 5,175,127 | 12/1992 | Manning . |
| 5,298,450 | * 3/1994 | Verret ................................... 438/424 |
| 5,316,965 | 5/1994 | Philipossian et al. . |
| 5,646,063 | 7/1997 | Mehta et al. . |
| 5,702,976 | 12/1997 | Schuegraf et al. . |
| 5,719,085 | 2/1998 | Moon et al. . |
| 5,721,173 | 2/1998 | Yano et al. . |
| 5,728,621 | * 3/1998 | Zheng et al. . |
| 5,729,043 | 3/1998 | Shepard . |
| 5,741,740 | 4/1998 | Jang et al. . |
| 5,872,043 | * 2/1999 | Chen .................................... 438/424 |
| 6,048,771 | * 4/2000 | Lin et al. ............................. 438/424 |
| 6,048,775 | * 4/2000 | Yao et al. ............................. 438/424 |
| 6,159,822 | * 12/2000 | Yang et al. .......................... 438/427 |

FOREIGN PATENT DOCUMENTS

019741704A1 * 9/1997 (DE) ............................ H01L/21/762

OTHER PUBLICATIONS

Anonymous, "Sensitive Surface Damage Avoidance During Polishing", Research Disclosure, Kenneth Mason Publications Limited, Nov. 1991, No. 331.

Pye et al., "High–density plasma CVD and CMP for 0.25–um intermetal dielectric processing" Solid State Technology, Dec. 1995, pp. 65–72.

Moreau, Wayne M., "Semiconductor Lithography Principles, Practices, and Materials", Microdevices Physics and Fabrication Technologies, 1987, pp. 720–729.

* cited by examiner

*Primary Examiner*—Charles Bowers
*Assistant Examiner*—David S Blum
(74) *Attorney, Agent, or Firm*—Howard J. Walter, Jr.; McGinn & Gibb, PLLC

(57) ABSTRACT

A method is provided for planarizing a structure such as a shallow trench isolation region on a semiconductor substrate. A semiconductor substrate is provided having raised and lowered regions with substantially vertical and horizontal surfaces. The lowered regions may correspond to trench regions. Filler material such as non-conformal high density plasma oxide may be deposited over the horizontal surfaces to at least a thickness equal to a predetermined height so as to provide raised and lowered regions of the filler material. The raised regions of the filler material may then be selectively removed without removing the filler material in the lowered regions.

20 Claims, 7 Drawing Sheets

LOW COST SHALLOW TRENCH ISOLATION USING NON-CONFORMAL DIELECTRIC MATERIAL

BACKGROUND OF THE INVENTION

1. Field of the Invention

The present invention generally relates to a process to form planarized shallow trench isolation structures using a non-conformal high density plasma (HDP) oxide deposition.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit device technology has advanced and integrated circuit device dimensions have decreased, it has become increasingly common within advanced integrated circuits to employ trench isolation methods such as shallow trench isolation (STI) methods and recessed oxide isolation (ROI) methods to form trench isolation regions nominally co-planar with adjoining active semiconductor regions of semiconductor substrates. Such trench isolation methods typically employ a chemical mechanical polish (CMP) planarizing method to provide a nominally planarized surface to a trench isolation region foxned from a trench fill dielectric layer formed within the trench. Trench isolation regions nominally co-planar with active semiconductor regions within semiconductor substrates are desirable since they optimize, when subsequently forming patterned layers upon those nominally co-planar trench isolation regions and active semiconductor regions the limited depth of focus typically achievable with advanced photo exposure.

Two major challenges in achieving the shallow trench isolation (STI) structure are: (1) filling the narrow trenches without voids or seams defect, and (2) planarization of trenches of diverse widths. Conventional STI processes may employ conformal low pressure chemical vapor deposition (LPCVD) TEOS deposition and a complicated planarization process which uses two step photo-resist coating, reactive ion etch (RIE) etch back and chemical mechanical polish (CMP). Due to the nature of conformal LPCVD TEOS deposition, seams are generally present in the LPCVD TEOS filled shallow trench isolation region. The seams become a major problem as the device dimensions scale downward and the aspect ratio of the STI increases.

SUMMARY OF THE INVENTION

In view of the foregoing and other problems of the conventional methods, it is, therefore, an object of the present invention to provide a method for planarizing a structure on a semiconductor substrate. The method may include providing the semiconductor substrate having raised and lowered regions with substantially vertical and horizontal surfaces. The vertical surfaces may have a predetermined height. Further, the method may include depositing filler material over the horizontal surfaces to at least a thickness equal to the predetermined height so as to provide raised and lowered regions of the filler material. The method may also include selectively removing the raised regions of the filler material.

The filler material may be non-conformal high density plasma (HDP) oxide. Additionally, the lowered regions of filler material may be covered with a mask and the filler material on the raised regions may be etched. The raised regions may not be protected by the mask.

An oxide pad and a nitride pad may be provided on the semiconductor substrate. The raised and lowered regions may be formed by masking regions of the nitride pad and etching exposed areas of the nitride pad. The oxide pad and the nitride pad may be further removed after selectively removing the raised regions of the filler material. Further, only the raised regions of the filler material are etched without etching the lowered regions of the filler material.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS OF THE INVENTION

Figure 1:
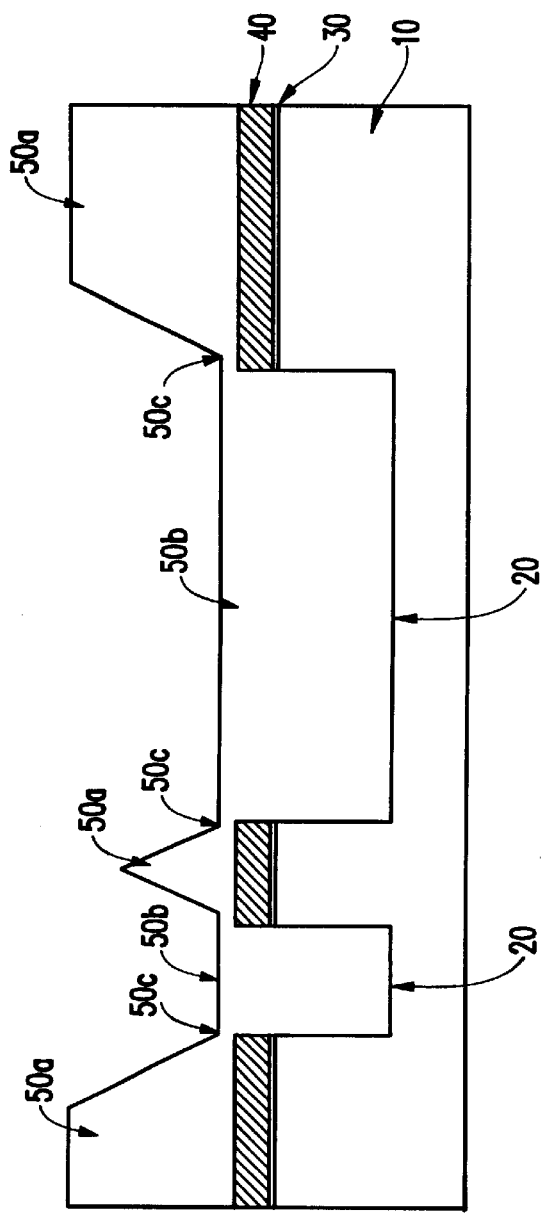
FIGS. 1–6 show cross section views of the STI filled with non-conformal HDP oxide according to the present invention.

FIG. 1 shows a preferred method of forming a shallow trench isolation (STI) region using non-conformal dielectric material such as non-conformal high density plasma oxide. In this method, a silicon substrate 10 is initially provided and an oxide pad 30 and a nitride pad 40 are then formed over silicon substrate 10. A trench region 20 is then formed into the silicon substrate 10 in a conventional manner. Normally the trench region 20 is delineated by 1) applying a thin coat of photoresist on the wafer, 2) exposing selected regions of the photoresist to light in order to induce a chemical change in the photoresist, and 3) removing the exposed portions of the photoresist by wet-chemical means. Then the exposed regions of the wafer are removed to a desired depth using an anisotropic subtractive etch process. Conventional and appropriate subtractive etch methods include reactive ion etching, which is also known as plasma etching or dry etching. Such an etch process normally exhibits high uniformity, high selectivity to the photoresist or other masking material, and high directionality (anisotropy).

A filler material preferably formed of non-conformal high density plasma oxide 50 is provided over the entire silicon substrate and in the trench region 20 using a conventional deposition process. Pure silicon dioxide is preferably used, although doped oxides containing small amounts of phosphorous or boron may also be used. Further, fluorine may be useful for lowering the dielectric constant of the isolation. In general, any material which can be made in the form shown in the figures and is also useful as a trench isolation material can be used. The preferred material properties include good gap-fill, low dielectric constant, high purity, and thermal and chemical stability in the presence of other semiconductor device materials. As shown in FIG. 1, the oxide material in the trench 50b should be very uniform and slightly thicker than the depth of the trench region 20. The filler material at the upper edge of the trench 50c should also be of uniform thickness, and preferably on the order of the thickness of the nitride film 40 or thinner. The invention can accommodate some variation in the thickness and sidewall-profile of the non-trench oxide material 50a.

Unlike conventional methods, the non-conformal dielectric material, such as the high density plasma oxide, fills the trench region 20 without any seams defect. That is, HDP oxides can be made to have excellent gap-fill characteristics because the extra energy available in a high-density plasma system allows the balance in the competition between etching and deposition to be finely adjusted. In practice, a balance is struck that allows deposition to occur much more effectively on horizontal surfaces than on vertical ones. For example, argon bombardment knocks off the oxide formed on vertical surfaces and redeposits it on horizontal surfaces in the trench region 20. This sputter/deposition method achieves a non-conformal seams-free trench fill. For HDP oxide, this same balance between etching and deposition leads to the other features of the trench fill that are important to the invention.

The oxide 50 fills the trench region 20 to a predetermined height, which will be maintained throughout the entire planarization process. This predetermined height is preferably greater than a depth of the trench region 20 as measured from the bottom of the trench region 20 to a bottom of the oxide pad 30. As is known in the art, if the trench structure were made entirely of oxide, and that oxide were bombarded with high-energy ions as are present in a physical-sputtering tool (or in a high-density plasma deposition tool) then the exposed corners of oxide would quickly become beveled, generally at a 45-degree angle. This occurs because the atoms on the exposed corner are the easiest to dislodge. Under the right circumstances, the oxide that gets knocked off the exposed corners can collect in the interior corners at the bottom of small trenches. These things all occur at once in a typical HDP oxide deposition process. That is, oxide material tends to deposit everywhere uniformly, but is preferentially knocked off the sides of existing vertical surfaces in the substrate (allowing for excellent gap-fill) and off of the growing shoulder at the upper edge of these surfaces to form the sloped, beveled edges in the raised portion of the oxide.

Figure 2:
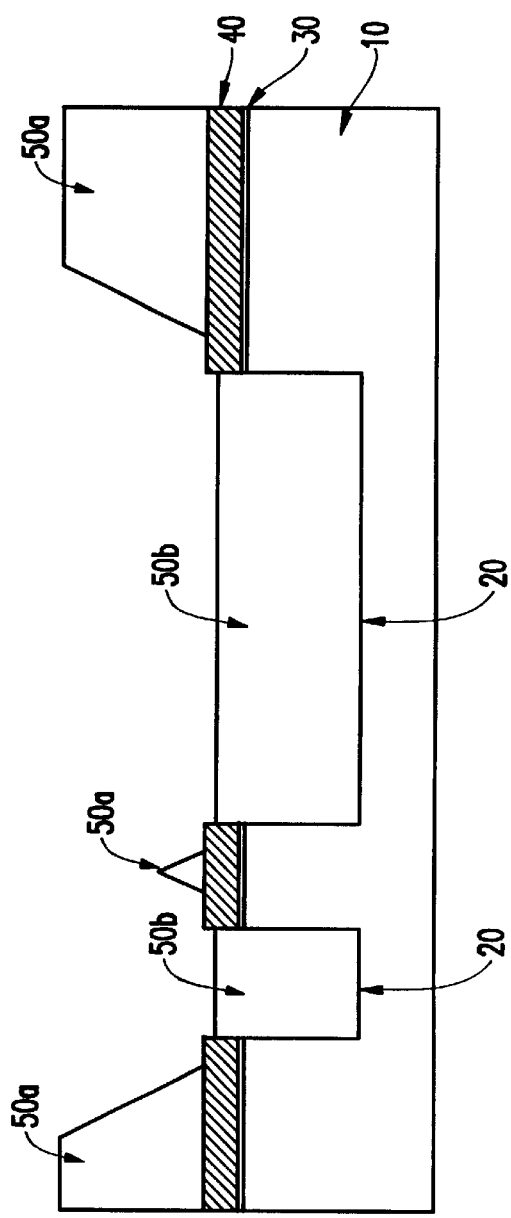

Before the photoresist is applied to the wafer surface and patterned, the deposited filler material is etched slightly, as shown in FIG. 2. This etch step is performed in order to remove all of that portion of the filler material 50c shown in FIG. 1, which acts to expose the pad nitride 40 in those regions. In other words, the upper part of the oxide is separated from the oxide in the trench region 20 after a short pull-back DHF (or BHF) oxide etch. An equal amount of films 50a and 50b are likewise removed by the etch process, which for simplicity has been illustrated as an isotropic or non-directional etch. This etching results in a structure similar to that shown in FIG. 2. That is, the trench oxide 50b is completely separated from the non-trench oxide 50a, and the pad nitride 40 is the only material exposed between those regions.

Figure 3:
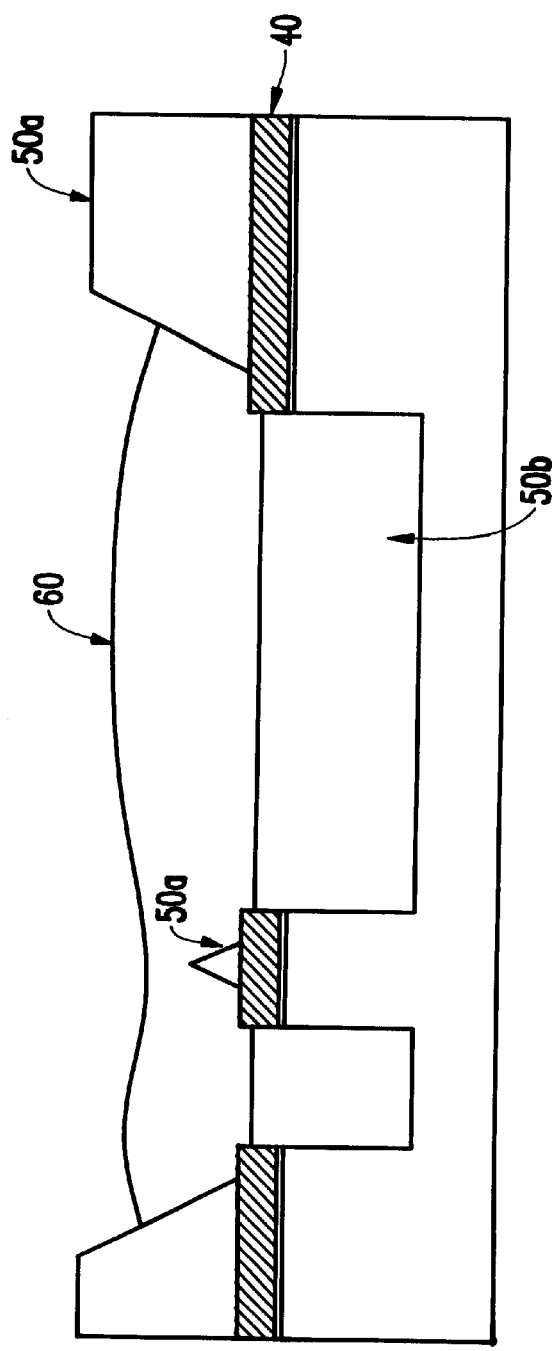
Figure 4:
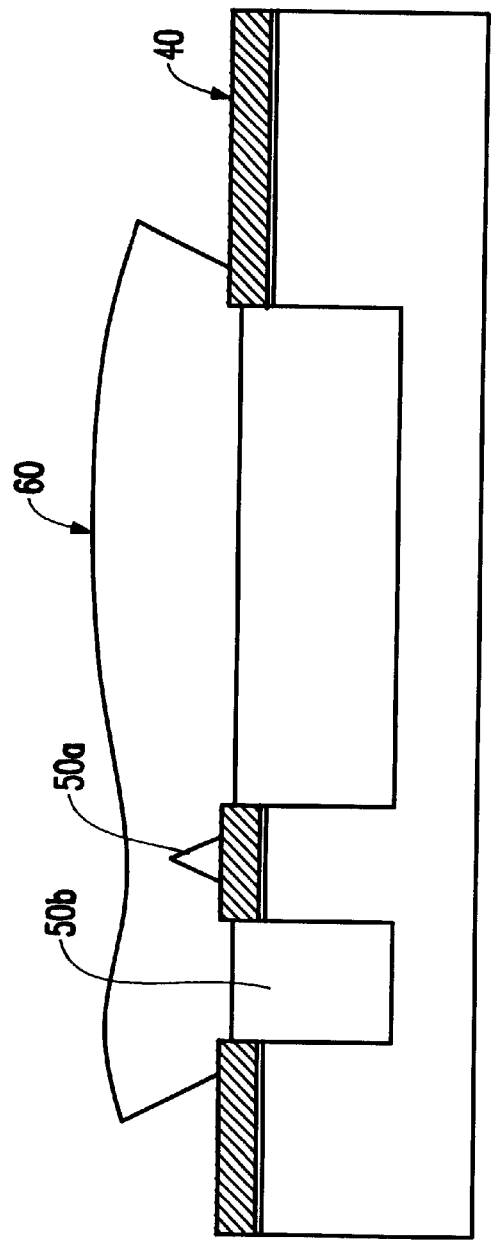

FIG. 3 shows an encapsulation photo resist 60 which is applied over the trench region 20 to protect the oxide 50 within the trench region 20. This photo resist 60 can be any film that can be patterned and is resistant to oxide etching. The encapsulation photo resist 60 protects the high density plasma oxide 50 within the trench region 20 and maintains the oxide 50 at the predetermined height while the remaining high density plasma oxide 50 is etched away in a well-known manner, as shown in FIG. 4. Any subtractive etch that is selective to photo resist 60 and pad film 40 (normally nitride) will suffice. An etch process that is largely isotropic is beneficial, but etch isotropy is not a necessary feature. A hydrofluoric-acid containing wet-etch is preferred, because it is quick, cheap, selective to nitride and photo resist, and it is isotropic. This last characteristic allows portions of the oxide 50a that are partially covered by photo resist 60 to also be etched away. The high selectivity to nitride and photo resist allows the oxide filler material 50b to be protected from the etchant, by virtue of the intimate contact between nitride 40 and photo resist 60 at all upper edges of the isolation trenches. Creating and maintaining a tight seal at these interfaces is important. Any small, narrow regions of non-trench oxide 50a that are completely covered by photo resist 60 can be accommodated by the subsequent processing. Such regions might or might not be present on a wafer surface, depending on the specific morphology of the HDP deposit and whether restrictions are placed on the design to prohibit them. After the exposed regions of the non-trench oxide 50a are removed, the photo resist 60 is removed by conventional means.

Figure 5:
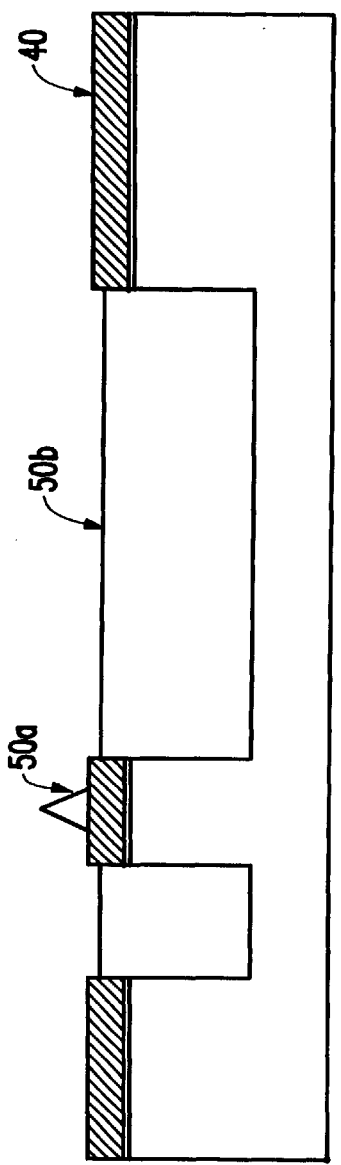
Figure 6:
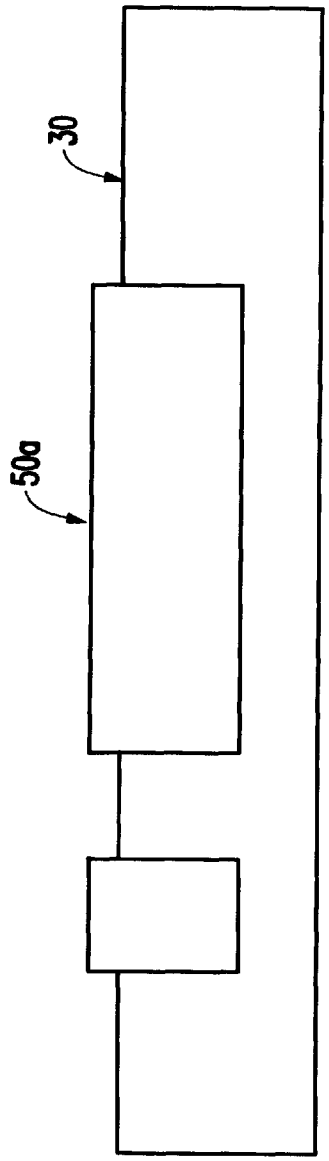
Figure 7:
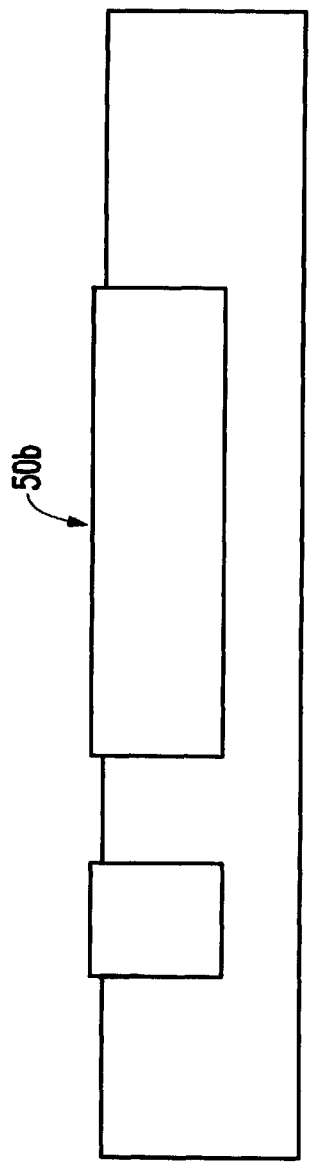
FIG. 7 shows a cross section view of the planarized STI structure.

FIG. 5 shows the result of the etching process in which the high density plasma oxide 50a in the non-trench regions has been removed, except possibly for small, narrow, isolated regions as depicted. Accordingly, the etching removes all of the HDP oxide 50 that is not protected by the encapsulation photo resist 60 and then the encapsulation photo resist 60 is removed. The nitride pad 40 is next removed, as shown in FIG. 6. Small quantities of dopant species are often implanted into the silicon substrate 10 through the pad oxide 30 before the pad oxide 30 is removed. The pad nitride 40 is preferably removed by subtractive etch. A phosphoric-acid containing wet-etch is common. The pad nitride 40 is used as a buffer film to protect the raised regions of the silicon (where the semiconductor devices themselves are to be built) during the trench isolation fabrication process. Once the isolation trenches have been formed, filled and planarized, the pad nitride 40 is preferably removed to allow for the shallow implantation of trace dopants to effect the desired electrical behavior in the subsequent semiconductor devices. After implantation, the pad oxide 30 is normally removed and a very thin, very high-purity oxide is grown on the exposed raised portions of the silicon substrate 10. This thin oxide becomes the "transfer gate oxide" that covers the "channel region" of the semiconductor "switches". FIG. 7 shows the resulting STI structure formed using the non-conformal high density plasma oxide 50. As discussed above, the resulting STI is seamless due to the non-conformal HDP oxide 50.

Figure 8:
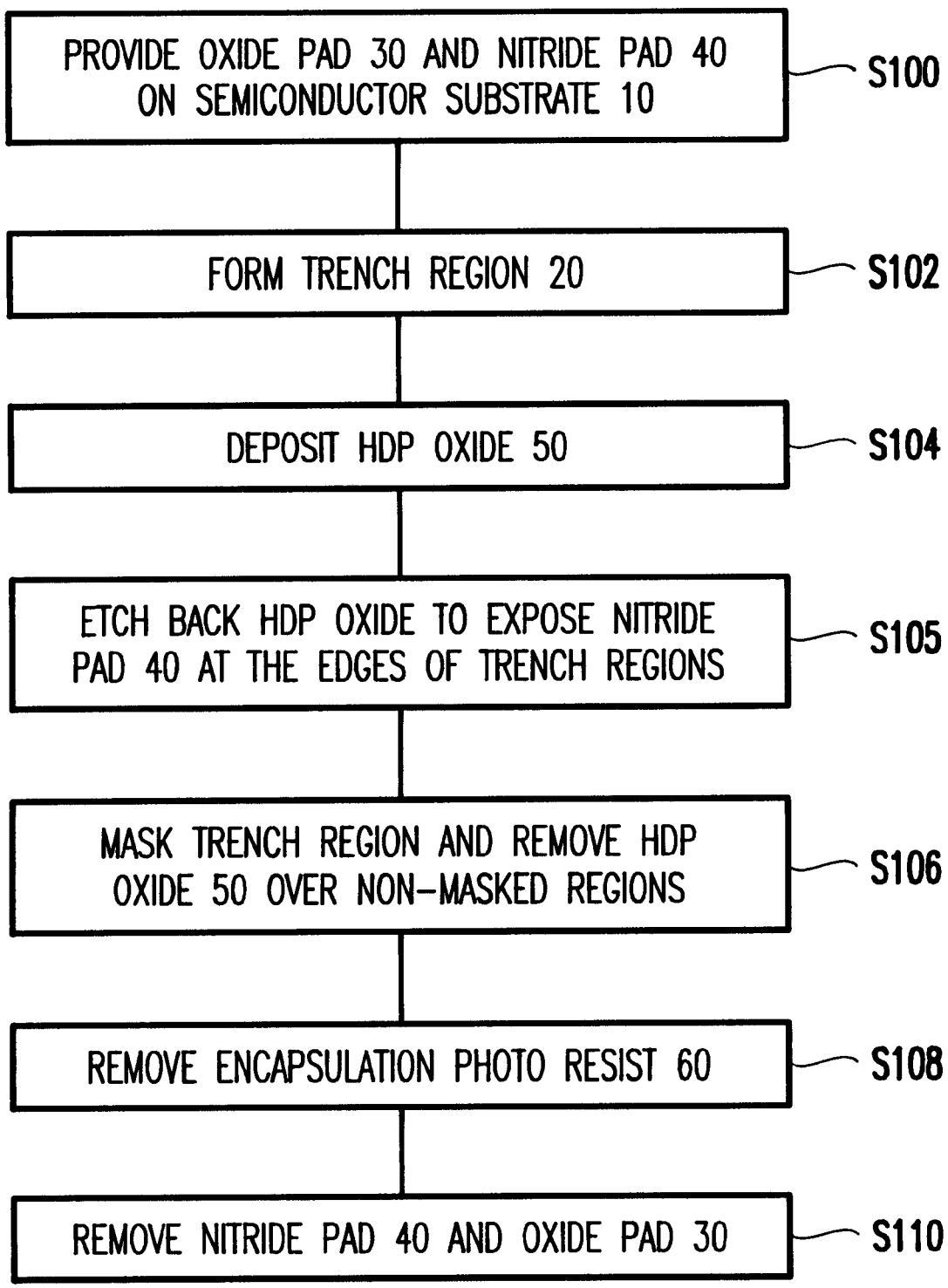
FIG. 8 shows a flowchart of a preferred method of the present invention.

FIG. 8 shows a flowchart of the method according to the present invention for forming the STI using the non-conformal high density plasma 50. In step S100, the oxide pad 30 and nitride pad 40 are provided on the semiconductor substrate 10. The trench region 20 is then formed in step S102. The non-conformal high density plasma oxide 50 is deposited over the entire semiconductor substrate 10 including the trench region 20 and the non-trench regions in step S104. The deposited trench-fill material is etched slightly in step S105 to expose the pad nitride 40 all along the boundary between trench oxide 50b and non-trench oxide 50a. The trench region 20 is masked in step S106 and the high density plasma oxide 50 is removed from the non-masked regions which are the non-trench regions. This is preferably accomplished using the encapsulation photo resist 60. In step S108, the encapsulation photo resist 60 is removed. Subsequently, in step S110, the nitride pad 40 and oxide pad 30 are removed resulting in the planarized STI.

Figure 9:
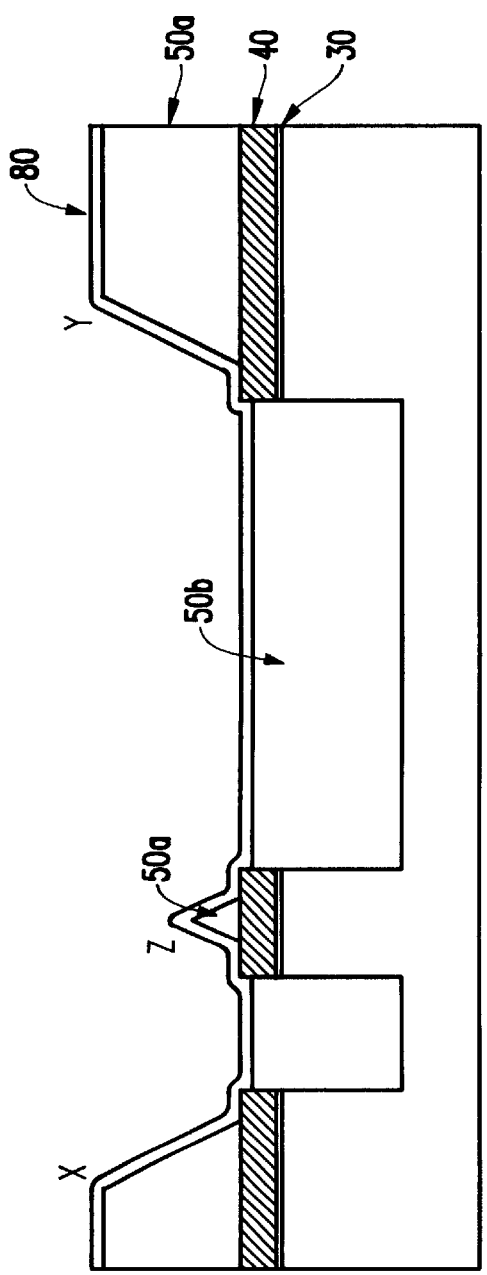
FIGS. 9–11 show steps of planarization according to the present invention.
Figure 10:
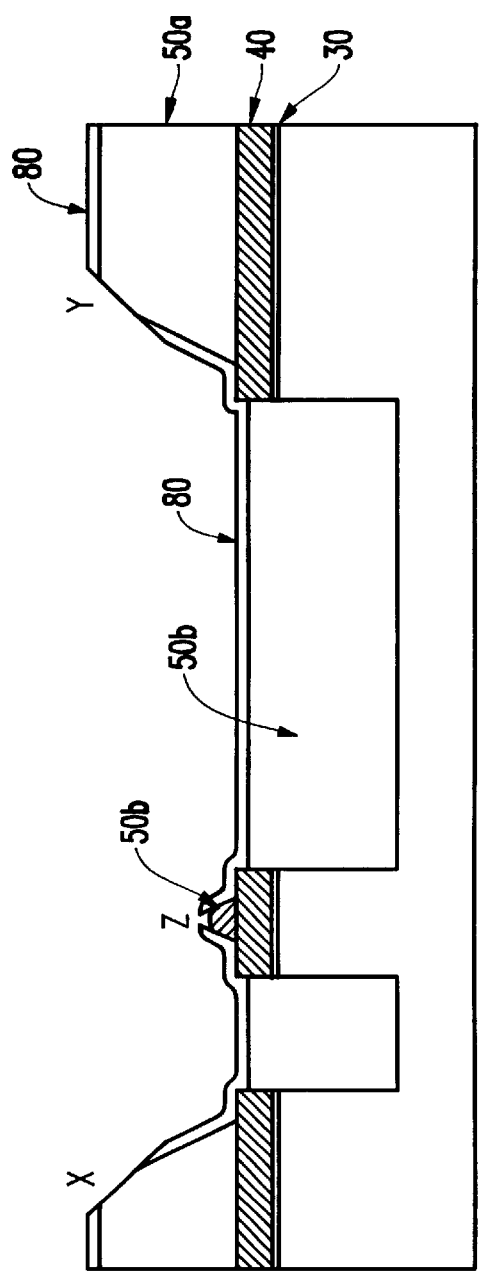
Figure 11:
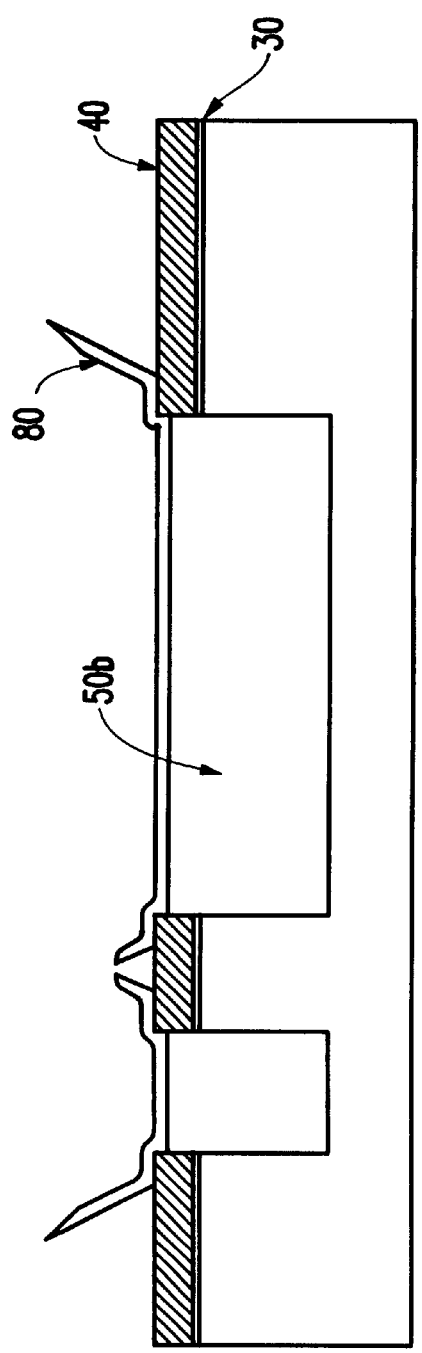
Figure 12:
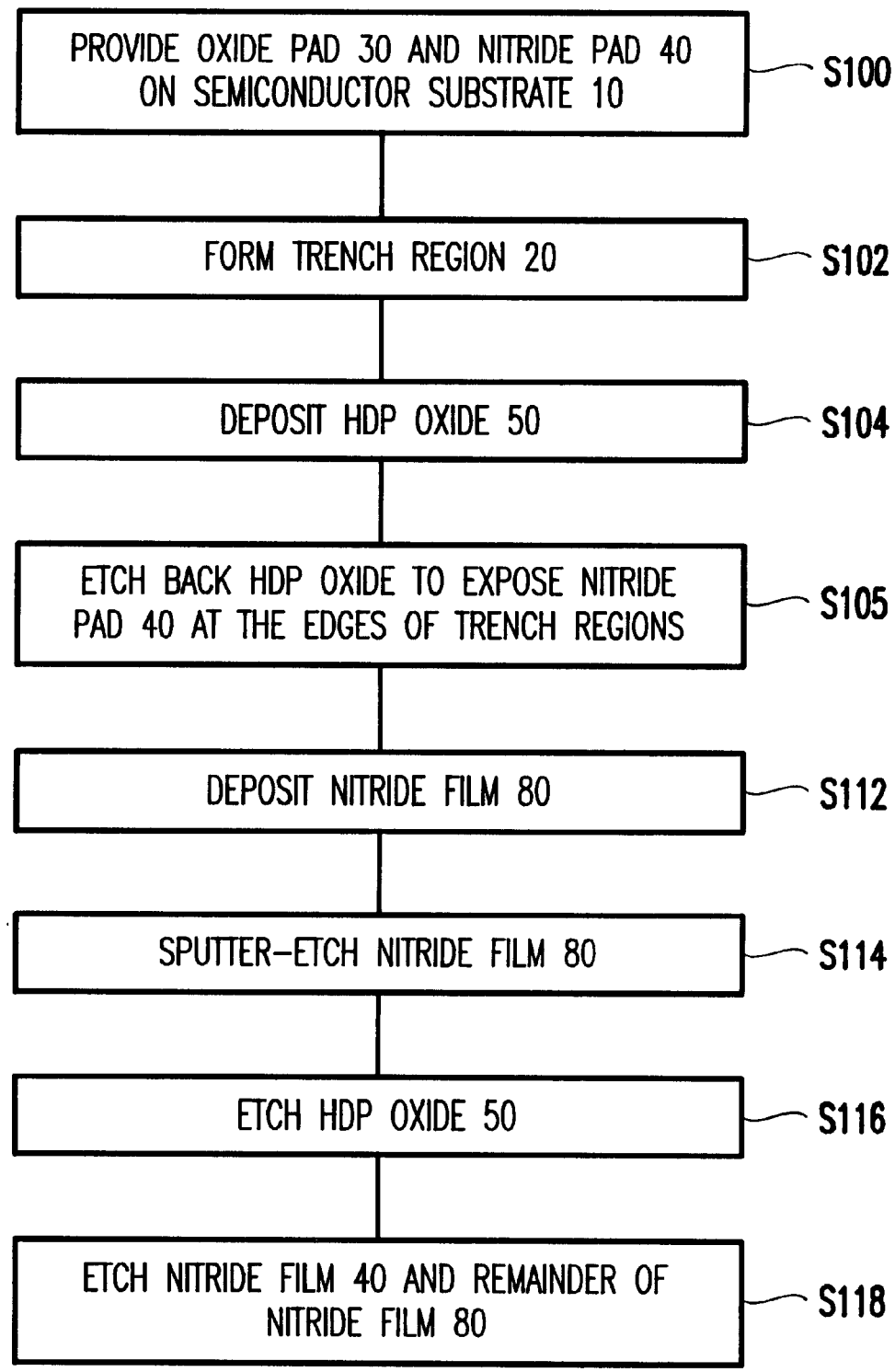
FIG. 12 shows a flowchart according to the method shown in FIGS. 9–11.

FIGS. 9–11 show an additional embodiment of forming the planarized STI and FIG. 12 shows a corresponding flowchart. In this embodiment, the oxide pad 30 and nitride pad 40 are formed on the semiconductor substrate 10 in step S100 and the trench regions 20 are subsequently formed in step S102. In a similar manner, the high density plasma oxide 50 is applied in step S104, and the oxide film is etched back in step S105, in order to expose the nitride pad 40 at the edges of the trench regions in a similar manner to that shown in FIG. 2. Then, in step S112, a conformal film such as a silicon nitride film 80 is applied over the deposited high density plasma oxide 50, as shown in FIG. 9. In step S114, the conformal film 80 is sputter-etched so as to expose portions of each discrete piece of the non-trench high-density plasma oxide film 50*b* at exposed corners, such as at regions X, Y and Z shown in FIG. 10. Physical sputtering processes are well-known to be able to preferentially remove material from exposed corners such as X, Y and Z. Subsequently, in step S116, the overburden of the non-trench high density plasma oxide 50*a* is removed using an isotropic etch process that is highly selective to the conformal film 80 and to the nitride pad 40 as shown in FIG. 11. A wet etchant containing hydrofluoric acid is preferred because it is quick cheap, selective to nitride, and it is isotropic. Finally, in step S118, the remainder of the conformal film 80 is removed along with the pad nitride film 40 using an isotropic etch process that is highly selective to the pad oxide and to the remaining high density plasma oxide 50*b*. A phosphoric-acid containing wet-etch is commonly used for this purpose. If a small, narrow region of non-trench oxide material 50*a* (such as region Z in FIG. 9) is not exposed by the sputter-etch (or similar) process in step S114, then they will remain on the wafer after the isotropic oxide etch of step S116. But as such remaining regions of oxide 50*a* are small, if they exist at all, they will float off the wafer as they are undercut by the isotropic nitride etch in step S118. This results in the planarized STI structure shown in FIG. 6. As in the previous embodiment, further processing to remove the oxide pad 30, according to step S118, results in the fully planarized structure depicted in FIG. 7.

This invention results in a novel, yet very simple process to form a planarized STI structure using non-conformal high density plasma (HDP) oxide deposition and photo resist encapsulation planarization. This has at least three major advantages as compared with conventional STI processes. First, this invention eliminates many process steps employed by the current STI process such as photo resist planarization, reactive ion etching (RIE), etch back and CMP. Second, a non-conformal dielectric material such as high density plasma (HDP) oxide fills the trenches without any seams defect. All RIE and CMP related defects such as particulate contamination, CMP scratches and chatter markers may be eliminated using the present invention. Third, the present invention achieves uniform local and global planarization without adding any constraints to RX mask layout.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A method of planarizing a structure on a semiconductor substrate, the method comprising:

depositing a pad material on said semiconductor substrate;

forming raised and lowered regions with substantially vertical and horizontal surfaces on said semiconductor substrate, said vertical surfaces having a predetermined height;

depositing filler material by high density plasma method over said horizontal surfaces to at least a thickness equal to said predetermined height so as to provide raised and lowered regions of filler material;

separating adjacent sections of said raised and lowered regions of filler material by at least a gap of exposed underlying pad material; and selectively removing said raised regions of said filler material.

2. The method of claim 1, wherein said filler material comprises non-conformal high density plasma oxide.

3. The method of claim 1, wherein said selectively removing comprises covering said lowered regions of filler material with a mask and etching said filler material on said raised regions which are not protected by said mask.

4. The method of claim 1, further comprising covering said lowered regions of filler material with a conformal coating, and wherein said selectively removing comprises removing said coating from substantially all of said raised regions, and etching said filler material on said raised regions, wherein during said selectively removing adjacent sections of said upper and lower regions of filler material are separated by at least a gap of exposed underlying pad material.

5. The method of claim 1, wherein said pad material an oxide pad formed on said semiconductor substrate and a nitride pad formed on said oxide pad, and wherein said raised and lowered regions are formed by masking regions of the nitride pad and etching exposed areas of said nitride pad.

6. The method of claim 5, further comprising removing said oxide pad and said nitride pad after selectively removing said raised regions of said filler material.

7. The method of claim 1, wherein selectively removing comprises selectively etching only said raised regions of said filler material without etching said lowered regions of said filler material.

8. A method for planarizing a trench region provided in a semiconductor substrate, the method comprising:

depositing a pad material on a non-trench region of said semiconductor substrate;

forming at least one trench region in said semiconductor substrate;

applying a filler material by high density plasma method in the trench region and on the semiconductor substrate;

separating adjacent sections of said trench region and a non-trench region of filler material by at least a gap of exposed underlying pad material; and removing only said filler material which is not provided in said trench region.

9. The method of claim 8, wherein said filler material comprises non-conformal high density plasma oxide.

10. The method of claim 8, wherein the removing comprises covering the trench region with a mask and etching said filler material from regions which are not protected by said mask.

11. The method of claim 8, further comprising covering said trench region with a conformal coating, and wherein said removing comprises removing said coating from substantially all non-trench regions and etching said filler material on the non-trench regions.

12. The method of claim 8, wherein said pad material an oxide pad formed on said semiconductor substrate and a nitride pad formed on said oxide pad, and wherein said at least one trench region is formed by masking regions of said nitride pad and etching exposed areas of said nitride pad.

13. The method of claim 12, further comprising removing said oxide pad and said nitride pad after removing the filler material which is not provided in the trench region.

14. A method of forming a planarized structure on a semiconductor substrate, the method comprising:

depositing a pad material on said semiconductor substrate;

forming a trench region and non-trench regions on said semiconductor substrate;

depositing filler material by high density plasma method on said trench region and said non-trench regions, said filler material filling said trench region to a predetermined height;

separating adjacent sections of said trench region and said non-rench region of filler material by at least a gap of exposed underlying material; and removing said filler material from said non-trench regions while allowing said filler material in said trench region to remain filled to the predetermined height.

15. The method of claim 14, wherein said filler material comprises non-conformal high density plasma oxide.

16. The method of claim 14, wherein said, removing comprises covering said trench regions of filler material with a mask and etching said filler material on said non-trench regions which are not protected by said mask.

17. The method of claim 14, wherein the removing comprises covering said trench regions of filler material with a conformal coating, and wherein said removing comprises removing said coating from substantially all of said non-trench regions, and etching said filler material on said non-trench regions, wherein during the removing adjacent sections of said trench region and non-trench region of filler material are separated by at least a gap of exposed underlying pad material.

18. The method of claim 14, wherein said pad material comprises an oxide pad formed on said semiconductor substrate and a nitride pad formed on said oxide pad, and wherein said trench region and the non-trench regions are formed by masking regions of said nitride pad and etching exposed areas of said nitride pad.

19. The method of claim 18, further comprising removing said oxide pad and said nitride pad after removing said filler material on the non-trench regions.

20. The method of claim 14, wherein the removing comprises selectively etching said filler material on the non-trench regions without etching said filler material on the trench regions.

* * * * *